(12) United States Patent
Kang

(10) Patent No.: US 7,893,614 B2
(45) Date of Patent: Feb. 22, 2011

(54) ORGANIC LIGHT EMITTING DISPLAY DEVICE AND METHOD OF FABRICATING THE SAME

(75) Inventor: Tae-Wook Kang, Suwon-si (KR)

(73) Assignee: Samsung Mobile Display Co., Ltd. (KR)

(*) Notice: Subject to any disclaimer, the term of this patent is extended or adjusted under 35 U.S.C. 154(b) by 616 days.

(21) Appl. No.: 11/876,681

(22) Filed: Oct. 22, 2007

(65) Prior Publication Data
US 2008/0150419 A1 Jun. 26, 2008

(30) Foreign Application Priority Data
Dec. 20, 2006 (KR) .................. 10-2006-0131056

(51) Int. Cl.
H01J 1/62 (2006.01)
H01J 9/26 (2006.01)
(52) U.S. Cl. ............... 313/512; 313/500; 313/504; 313/506; 445/24; 445/25
(58) Field of Classification Search ......... 313/498–512; 445/24, 25
See application file for complete search history.

(56) References Cited

U.S. PATENT DOCUMENTS
6,833,668 B1 * 12/2004 Yamada et al. .............. 313/505

2005/0122036 A1 * 6/2005 Park et al. .................. 313/504

FOREIGN PATENT DOCUMENTS

| JP | 2002-151252 | 5/2002 |
| KR | 10-2000-0022129 A | 4/2000 |
| KR | 10-2006-0048913 A | 5/2006 |
| WO | 97/50016 A1 | 12/1997 |

OTHER PUBLICATIONS

Office Action issued in the counterpart Korean Application No. 10-2006-0131056 in 3 pages, Oct. 26, 2007.

* cited by examiner

*Primary Examiner*—Bumsuk Won
(74) *Attorney, Agent, or Firm*—Knobbe Martens Olson & Bear LLP

(57) ABSTRACT

Disclosed is an organic light emitting display device (OLED). The OLED includes a substrate, an array of pixels, each pixel including a first electrode, an organic layer having an emission layer and a second electrode, an encapsulation substrate, a moisture absorbent layer and a spacer. The moisture absorbent layer is disposed in a predetermined region of the encapsulation substrate, and the spacer is disposed on the moisture absorbent layer. The spacer is formed on the encapsulation substrate or the moisture absorbent layer using a laser induced thermal imaging (LITI) process.

19 Claims, 6 Drawing Sheets

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2006-0131056, filed Dec. 20, 2006, the disclosure of which is incorporated herein by reference in its entirety.

BACKGROUND

1. Field

The present disclosure relates to an organic light emitting display device (OLED), and more particularly, to a spacer between structures of an OLED.

2. Discussion of the Related Technology

Nowadays, in order to overcome the shortcomings of conventional display devices such as cathode ray tubes (CRTs), much attention is being paid to flat panel display devices (FPDs), such as liquid crystal displays (LCDs), organic light emitting display devices (OLEDs), and plasma display panels (PDPs).

An LCD, which is a non-emissive device, has technical limits in brightness, contrast, viewing angle, and size. Also, a PDP is an emissive display, but the PDP is heavier, consumes higher power, and is more complex to manufacture as compared with other FPDs.

On the other hand, an OLED is an emissive device that has a wide viewing angle and a high contrast ratio. The OLED may be made lightweight and thin since an additional backlight unit is not required, and consume lower power. Also, the OLED can be driven with direct current at a low voltage and has a fast response time. Further, the OLED is fabricated using only solid materials, so that the OLED is highly resistant to external shock, applicable in a wide range of temperature, and simple and inexpensive to manufacture.

The discussion in this section is to provide general background information, and does not constitute an admission of prior art.

SUMMARY

An aspect of the invention provides an organic light emitting display device (OLED) comprising: a base substrate; an array of a plurality of organic light emitting pixels formed on the base substrate; an encapsulation substrate opposing the base substrate, wherein the array is interposed between the base substrate and the encapsulation substrate; a moisture absorbent layer formed on the encapsulation substrate and comprising a surface facing the array; and a spacer disposed between the moisture absorbent layer and the array, wherein the spacer contacts a selected portion but not all of the surface of the moisture absorbent layer.

In the foregoing OLED, the OLED may further comprise a thin film transistor (TFT) which comprises a semiconductor layer, a gate electrode, and source and drain electrodes. The OLED may further comprise an alignment key disposed on the encapsulation substrate. The spacer may be formed of an organic material. The spacer may be formed of an inorganic material. The spacer may contact a non-emissive surface of the array. The non-emissive surface may be interposed between immediately neighboring emissive surfaces of the array. The spacer may contact the surface of the moisture absorbent layer at a location that is on an imaginary line perpendicular to the surface of the moisture absorbent layer and passing a point on the non-emissive surface. The OLED may further comprise an encapsulant or seal interposed between and interconnecting the base substrate and the encapsulation substrate, wherein the encapsulant or seal may comprise a projection on a surface thereof facing the encapsulation substrate, wherein the encapsulation substrate may comprise a groove formed on a surface facing the base substrate and receiving the projection of the encapsulant or seal.

Another aspect of the invention provides a method of fabricating an OLED, comprising: providing a base substrate and an array of a plurality of organic light emitting pixels formed on the base substrate, wherein the array comprises a plurality of emissive surfaces and a plurality of non-emissive surfaces, wherein one of the non-emissive surfaces interposed between two neighboring emissive surfaces; providing an encapsulation substrate with a moisture absorbent layer and a spacer, wherein the moisture absorbent layer is formed on the encapsulation substrate, and wherein a spacer is formed on the moisture absorbent layer; and arranging and interconnecting the encapsulation substrate and the base substrate such that the spacer contacts the moisture absorbent layer and is interposed between the array and the moisture absorbent layer.

In the foregoing method, the method may further comprising forming a TFT on the base substrate, the TFT comprising a semiconductor layer, a gate electrode, and source and drain electrodes. The encapsulation substrate may comprise an alignment key. The spacer may be formed on the moisture absorbent layer by using a laser induced thermal imaging (LITI) process. The LITI process may comprise providing a donor substrate comprising a base layer, a light-to-heat conversion (LHC) layer and a transfer layer formed of a spacer material, wherein the a light-to-heat conversion (LHC) layer is interposed between the base layer and the transfer layer, bonding the donor substrate to the moisture absorbent layer formed on the encapsulation substrate, and irradiating laser beams on a selective region of the donor substrate so as to transfer a portion of the transfer layer and form the spacer. The spacer forming material layer may comprise an organic material. The spacer forming material layer may comprise an inorganic material. The spacer may contact a non-emissive surface of the array.

Yet another aspect of the invention provides an organic light emitting display device comprising: a first substrate; a second substrate opposing the first substrate; an array of organic light emitting pixels interposed between the first and second substrates; a desiccant layer formed on the second substrate; and a spacer interposed between the array and the desiccant layer, wherein the spacer contacts both the array and the desiccant layer, wherein the array comprises a plurality of emissive surfaces and a plurality of non-emissive surfaces, and wherein one of the non-emissive surfaces interposed between two neighboring emissive surfaces, wherein the spacer contacts one of the plurality of non-emissive surfaces of the array.

A further aspect of the invention provides a method of making the foregoing device, which comprises: providing the first substrate and the array formed on the first substrate; providing the second substrate, a desiccant layer and a spacer, wherein the desiccant layer is formed on the second substrate, wherein the spacer is formed on a portion of the desiccant layer such that the portion of the desiccant layer is interposed between the second substrate and the spacer; and arranging the first substrate and the second substrate such that the spacer contacts the array. In the foregoing method, the spacer may be formed on the desiccant layer by using a LITI process.

An aspect of the present invention provides an OLED and a method of fabricating the same in which a spacer is formed on an encapsulation substrate or a moisture absorbent layer using a laser induced thermal imaging (LITI) process. Thus, a spacer formation process can be simplified, the damage of the moisture absorbent layer can be reduced, and the damage of the OLED due to external shock can be prevented.

In an exemplary embodiment of the present invention, an OLED includes: a substrate including unit pixels, each unit pixel including a first electrode, an organic layer having an emission layer and a second electrode; and an encapsulation substrate including a moisture absorbent layer and a spacer disposed on the moisture absorbent layer, the moisture absorbent layer being disposed in a predetermined region of the encapsulation substrate.

In another exemplary embodiment of the present invention, a method of fabricating an OLED includes: providing a substrate; forming a first electrode on the substrate; forming an organic layer having at least an emission layer on the first electrode; forming a second electrode on the organic layer; providing an encapsulation substrate; forming a moisture absorbent layer on one surface of the encapsulation substrate; forming a spacer on the moisture absorbent layer; and bonding the encapsulation substrate to the substrate.

BRIEF DESCRIPTION OF THE DRAWINGS

The above and other features of the present invention will be described in reference to certain exemplary embodiments thereof with reference to the attached drawings in which.

DETAILED DESCRIPTION OF EMBODIMENTS

Figure 1:
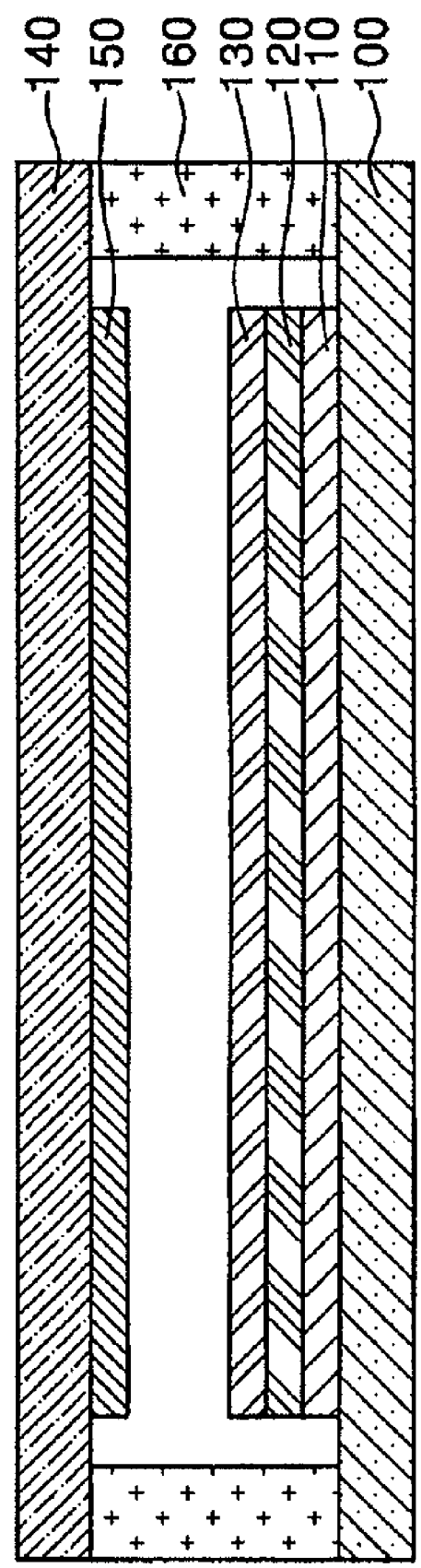
FIG. 1 is a cross-sectional view of an exemplary organic light emitting display device (OLED)

Embodiments of the present invention will now be described more fully hereinafter with reference to the accompanying drawings, in which exemplary embodiments of the invention are shown. In the drawings, the thicknesses of layers and dimensions of regions may be exaggerated for clarity. The same reference numerals are used to denote the same elements.

FIG. 1 is a cross-sectional view of an exemplary OLED. Referring to FIG. 1, an organic light emitting diode is disposed on a substrate 100, such as an insulating glass substrate or a plastic substrate. The organic light emitting diode includes a first electrode 110, an organic layer 120 including at least an emission layer, and a second electrode 130, which are sequentially stacked. The substrate 100 may further include a thin film transistor (TFT), which has a semiconductor layer, a gate electrode, and source and drain electrodes. An encapsulation substrate 140 is disposed opposite to the substrate 100, and a moisture absorbent layer 150 is disposed on one surface of the encapsulation substrate 140. Also, the substrate 100 and the encapsulation substrate 140 are encapsulated using an encapsulant 160.

However, in the above-described exemplary OLED, the encapsulation substrate 140 may sag due to external shock and come into contact with the organic light emitting diode so that the second electrode 130 or the organic layer 120 may be damaged. As a result, a failure in the organic light emitting diode may be caused, thus lowering the reliability of the OLED.

Figure 2:
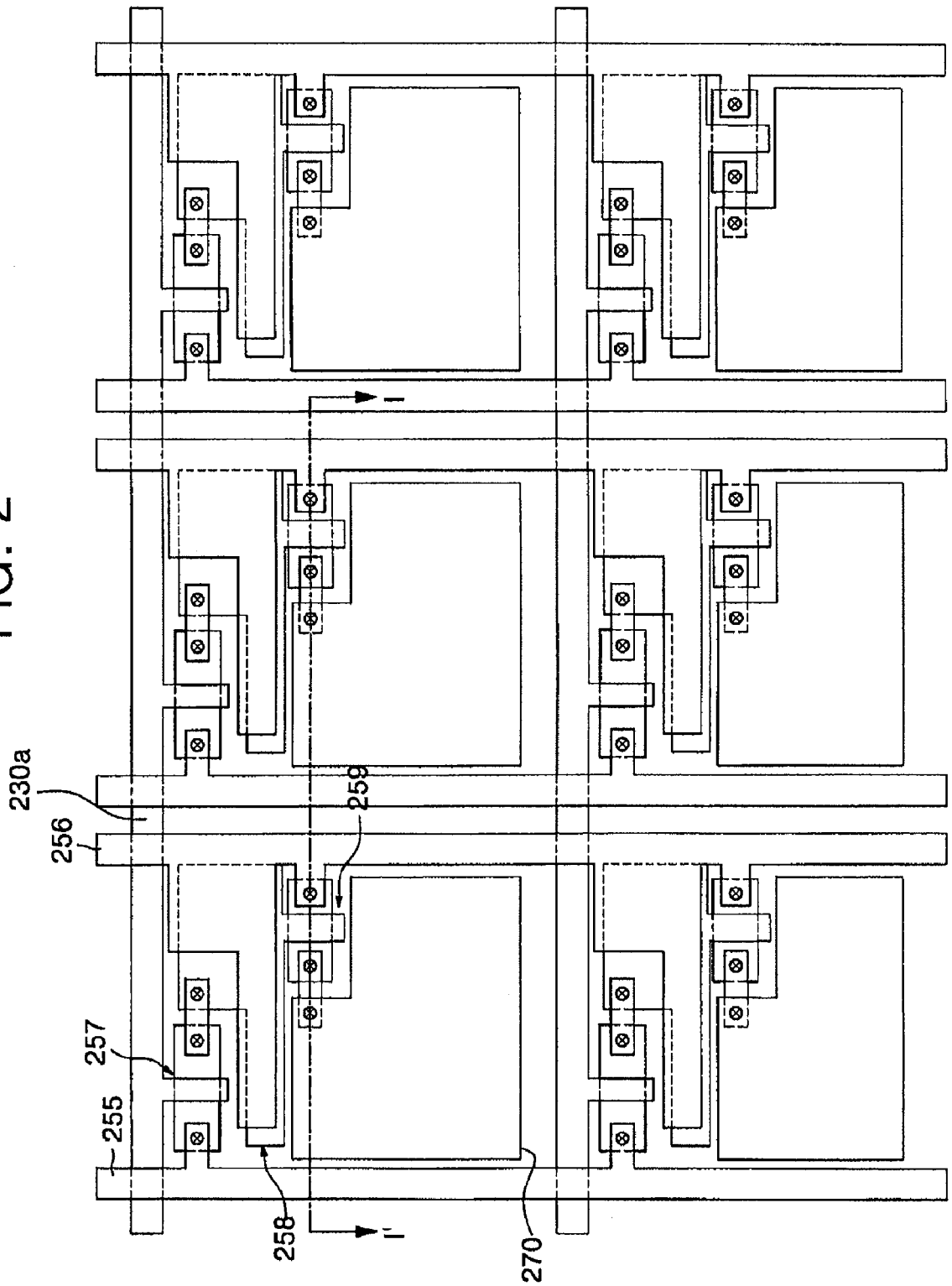
FIG. 2 is a plan view of an OLED according to an exemplary embodiment of the present invention.

FIG. 2 is a plan view of an organic light emitting display device (OLED) according to an exemplary embodiment of the present invention. Referring to FIG. 2, a unit pixel is defined by a scan line 230a and a data line 255. The scan line 230a is arranged in a direction, and the data line 255 is electrically insulated from the scan line 230a and intersects the scan line 230a. Also, a common power supply line 256 is electrically insulated from the scan line 230a and intersects the scan line 230a. The common power supply line 256 is arranged parallel to the data line 255.

The unit pixel includes a switching thin film transistor (TFT) 257, a capacitor 258, and a pixel-drive TFT 259. The switching TFT 257 switches a data signal applied to the data line 255 in response to a signal applied to the scan line 230a. The capacitor 258 receives the data signal through the switching TFT 257 and maintains the data signal for a predetermined period. The pixel-drive TFT 259 supplies a current to the first electrode 270 in response to the data signal applied through the switching TFT 257.

In each unit pixel, an organic layer (not shown) is disposed on the first electrode 270, and a second electrode (not shown) is disposed on the organic layer. The first electrode 270, the organic layer, and the second electrode constitute an organic light emitting diode. In the above-described structure, a spacer (not shown) is disposed in at least one of regions between the unit pixels immediately neighboring each other to support regions between a substrate and an encapsulation substrate.

Figure 3:
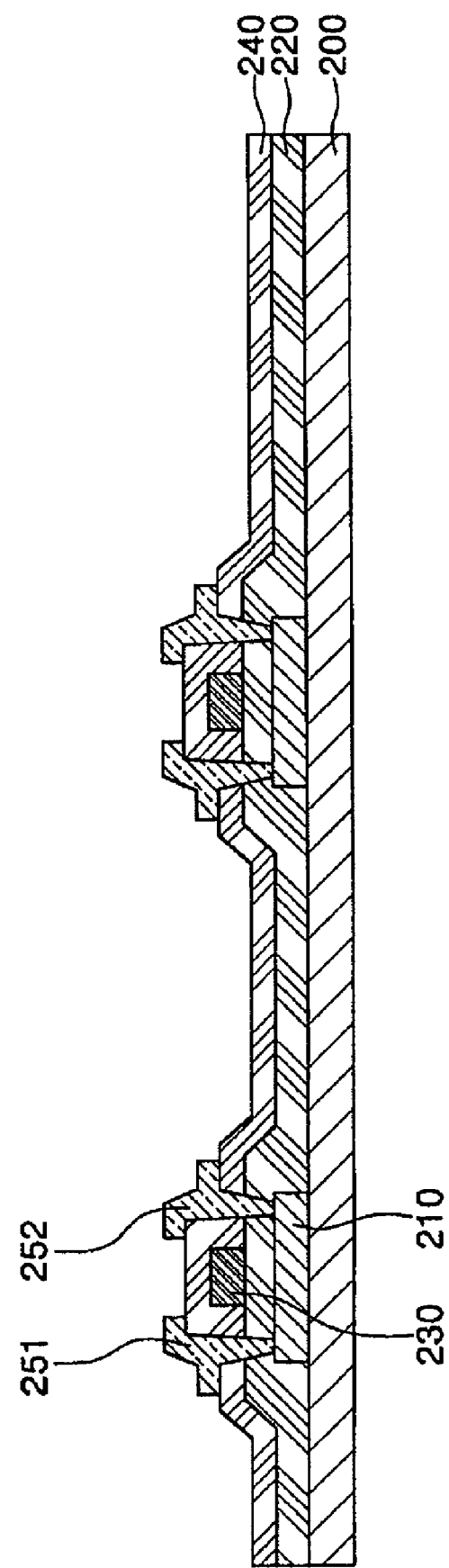
FIGS. 3 through 6 are cross-sectional views of an OLED according to an exemplary embodiment of the present invention.

Hereinafter, a process of fabricating an OLED according to an exemplary embodiment of the present invention will be described with reference to FIGS. 3 through 6. FIGS. 3 through 6 are cross-sectional views taken along line I-I' of FIG. 2. Referring to FIG. 3, a substrate or a first substrate 200, for example, an insulating glass substrate, a conductive substrate, or a plastic substrate, is provided. A semiconductor layer 210 is formed on the substrate 200. The formation of the semiconductor layer 210 may include depositing an amorphous silicon (a-Si) layer and crystallizing the a-Si layer into a polycrystalline silicon (poly-Si) layer. The crystallization of the a-Si layer may be performed using at least one of a rapid thermal annealing (RTA) process, a solid phase crystallization (SPC) process, an excimer laser annealing (ELA) process, a metal induced crystallization (MIC) process, a metal induced lateral crystallization (MILC) process, and a sequential lateral solidification (SLS) process.

Thereafter, a gate insulating layer 220 is formed on the substrate 200 including the semiconductor layer 210. The gate insulating layer 220 may be a silicon oxide layer, a silicon nitride layer, or a combination thereof. A gate electrode 230 is formed on the gate insulating layer 220 to correspond to the semiconductor layer 210. An interlayer insulating layer 240 is formed on the entire surface of the substrate 200 including the gate electrode 230. The interlayer insulating layer 240 may be a silicon oxide layer, a silicon nitride layer, or a combination thereof. Subsequently, the gate insulating layer 220 and the interlayer insulating layer 240 are etched to from a contact hole. A conductive material is stacked on the entire surface of the substrate 200 and then patterned, thereby forming source and drain electrodes 251 and 252. The source and drain electrodes 251 and 252 are connected to the semiconductor layer 210 through the contact hole.

Figure 4:
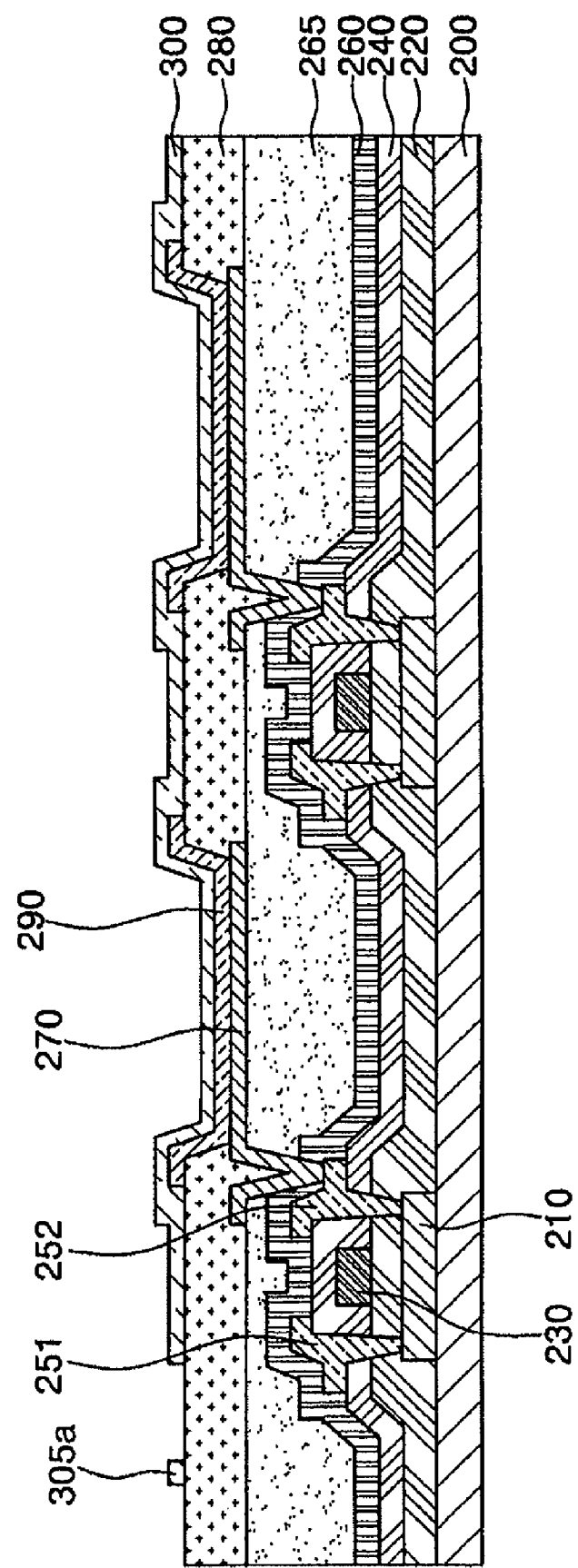

Referring to FIG. 4, a protection layer 260 and a planarization layer 265 are formed on the entire surface of the substrate 200. The protection layer 260 may be a silicon nitride layer, a silicon oxide layer or a combination thereof and function to protect an underlying TFT. Also, the planarization layer 265 may be formed of an organic material such as acryl resin or polyimide resin, or an inorganic material such as spin on glass (SOG). The protection layer 260 and the planarization layer 265 are etched to form a via hole exposing one of the source and drain electrodes 251 and 252. A transparent conductive material is deposited on the entire surface of the substrate 200 and then patterned, thereby forming a first electrode 270. The first electrode 270 is connected to one of the source and drain electrodes 251 and 252 through the via hole.

In this case, the first electrode 270 may be formed of a material having a high work function, for example, one selected from the group consisting of indium tin oxide (ITO), indium zinc oxide (IZO) and ZnO. In the case of a top-emitting OLED, the first electrode 270 may further include a reflective layer.

A pixel defining layer or pixel partitioning structure 280 is formed on the entire surface of the substrate 200 including the first electrode 270. In this case, the pixel defining layer 280 is formed to a sufficient thickness to fill the via hole in which the first electrode 270 is formed. The pixel defining layer 280 may be formed of an organic layer or an inorganic layer. Preferably, the pixel defining layer 280 may be formed of an organic layer. For example, the pixel defining layer 280 may be formed of one selected from the group consisting of benzocyclobutene (BCB), acryl polymer, and polyimide. Since the pixel defining layer 280 has excellent flowability, it may be flattened on the entire surface of the substrate 200. Thereafter, the pixel defining layer 280 may be etched to form an opening exposing the first electrode 270.

Thereafter, an organic layer 290 is formed on the first electrode 270 that is exposed by the opening. A second electrode 300 is formed on the entire surface of the substrate 200. The second electrode 300 may be formed of a material having a low work function, for example, one of Mg, Ag, Ca, Al, Li, Cu, and an alloy thereof. In the case of a top-emitting OLED, the second electrode 300 may be formed to a sufficiently small thickness to transmit light. In the case of a bottom-emitting OLED, the second electrode 300 may be formed to a sufficiently great thickness to reflect light.

During the formation of the second electrode 300, an alignment key 305a is formed in an encapsulation region of the substrate 200 where an encapsulant or seal 370 will be formed later or a scribe region. In the present exemplary embodiment, it is described that the alignment key 305a is formed during the formation of the second electrode 300, although not limited thereto. The alignment key 305a may be formed during the formation of the gate electrode 230, the source and drain electrodes 251 and 252 or the first electrode 270.

Figure 5:
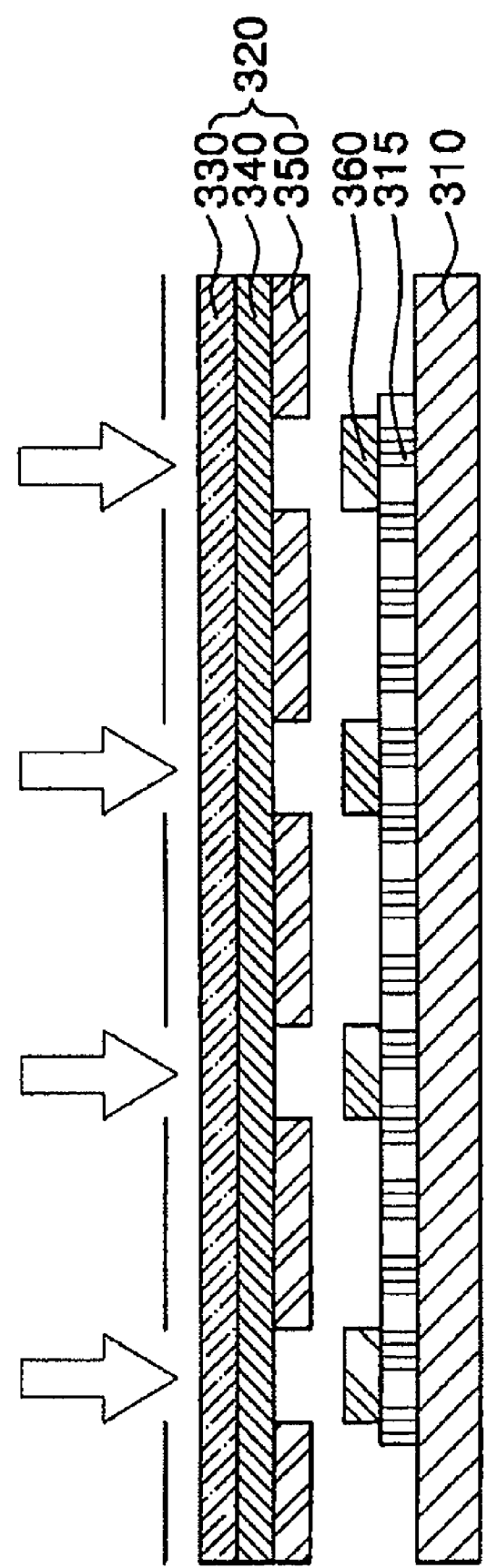

Referring to FIG. 5, an encapsulation substrate or a second substrate 310 formed of an insulating glass is provided. The encapsulation substrate 310 may be a substrate having a groove. In another embodiment, the encapsulation may be a planar substrate without a groove. Thereafter, a moisture absorbent layer 315 is formed on the encapsulation substrate 310. The moisture absorbent layer 315 may contain at least one material of a metal oxide and a metal salt with an average grain size of 100 nm or less, a binder, and a dispersant. When the average grain size of the material contained in the moisture absorbent layer 315 is more than 100 nm, scattering occurs in the visible light region, so that the moisture absorbent layer 315 looks hazy and has low transmittance.

In this case, the material selected from the metal oxide and the metal salt may be one selected from the group consisting of an alkali metal oxide, an alkaline-earth metal oxide, a metal halogenide, a metal sulfate and a metal perchlorate. More specifically, the alkali metal oxide may be one selected from the group consisting of lithium oxide ($Li_2O$), sodium oxide ($Na_2O$), and kalium oxide ($K_2O$), the alkaline-earth metal oxide may be one selected from the group consisting barium oxide (BaO), calcium oxide (CaO), and magnesium oxide (MgO), the metal sulfate may be one selected from the group consisting of lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate ($NiSO_4$), the metal halogenide may be one selected from the group consisting of calcium chloride ($CaCl_2$), magnesium chloride ($MgCl_2$), strontium chloride ($SrCl_2$), yttrium chloride ($YCl_2$), copper chloride ($CuCl_2$), cesium fluoride (CsF), tantalum fluoride ($TaF_5$), niobium fluoride ($NbF_5$), lithium bromide (LiBr), calcium bromide ($CaBr_3$), cerium bromide ($CeBr_4$), selenium bromide ($SeBr_2$), vanadium bromide ($VBr_2$), magnesium bromide ($MgBr_2$), barium iodide ($BaI_2$), and magnesium iodide ($MgI_2$), and the metal perchlorate may be one of barium perchlorate ($Ba(ClO_4)_2$) and magnesium perchlorate ($Mg(ClO_4)_2$).

Also, the dispersant may be one selected from the group consisting of an organic monomer dispersant, an organic polymer dispersant, an organic-inorganic hybrid polymer dispersant, an organic-inorganic hybrid monomer dispersant and an organic acid. For example, the dispersant may be epoxycyclohexyltrimethoxysilane. The moisture absorbent layer 315 may contain 1 to 100 parts by weight of the dispersant based on 100 parts by weight of one selected from the metal oxide and the metal salt.

Also, the binder may be at least one selected from the group consisting of an organic binder, an inorganic binder and an organic-inorganic hybrid binder. For instance, the binder may be acryl resin, methacryl resin (or PMMA), or polyisoprene (PI). The moisture absorbent layer 315 may contain 10 to 5000 parts by weight of the binder based on 100 parts by weight of one selected from the metal oxide and the metal salt. The moisture absorbent layer 315 may be formed on the encapsulation substrate 310 using a screen printing method or a dispensing method.

In the exemplary embodiment of the present invention, a transparent moisture absorbent layer having high light transmittance is exemplarily described as the moisture absorbent layer 315 and can be applied to both top- and bottom-emitting OLEDs, although not limited thereto. A moisture absorbent layer having low light transmittance may be used as the moisture absorbent layer 315 and applied to bottom-emitting OLEDs.

A donor substrate 320 is bonded to the encapsulation substrate 310 having the moisture absorbent layer 315. The donor substrate 320 includes a base layer 330, a light-to-heat conversion (LHC) layer 340 and a transfer layer 350. The base layer 330 should have transparence, optical properties, and mechanical stability in order to transmit light to the LHC layer 340. For example, the base layer 330 may be formed of glass or at least one polymer selected from the group consisting of polyester, polyacryl, polyepoxy, polyethylene, and polystyrene. Preferably, the base layer 330 may be formed of polyethylene terephthalate (PET). In this case, the base layer 330 functions as a support substrate and also, may be used as a multiple system.

Also, the LHC layer 340 absorbs light in the infrared (IR) and visible (V) light regions and converts a part of light into heat. The LHC layer 340 may be formed of a light absorbing material. Also, the LHC layer 340 may be an metal layer formed of one selected from the group consisting of Al, Ag, and oxides and sulfides thereof, or an organic material layer formed of one selected from the group consisting of carbon black, black lead and polymer containing an IR dye. The metal layer may be formed by a vacuum evaporation process, an electronic-beam deposition process, or a sputtering process, while the organic layer may be formed by an ordinary film coating process, for example, a gravure coating process, an extrusion coating process, a spin coating process or a knife coating process.

Also, the transfer layer 350 may be formed of a spacer forming material, such as an organic material or an inorganic material. Preferably, the transfer layer 350 may be formed of an organic material. More preferably, the transfer layer 350 may be formed of a resin. For example, the transfer layer 350 may be formed of one selected from the group consisting of BCB, acryl, cytop, and perfluorocyclobutene (PFCB). Thereafter, laser beams are irradiated to a predetermined region of the donor substrate 320 bonded to the encapsulation substrate 310, so that a spacer 360 is formed on the moisture absorbent layer 315 of the encapsulation substrate 310.

Figure 6:
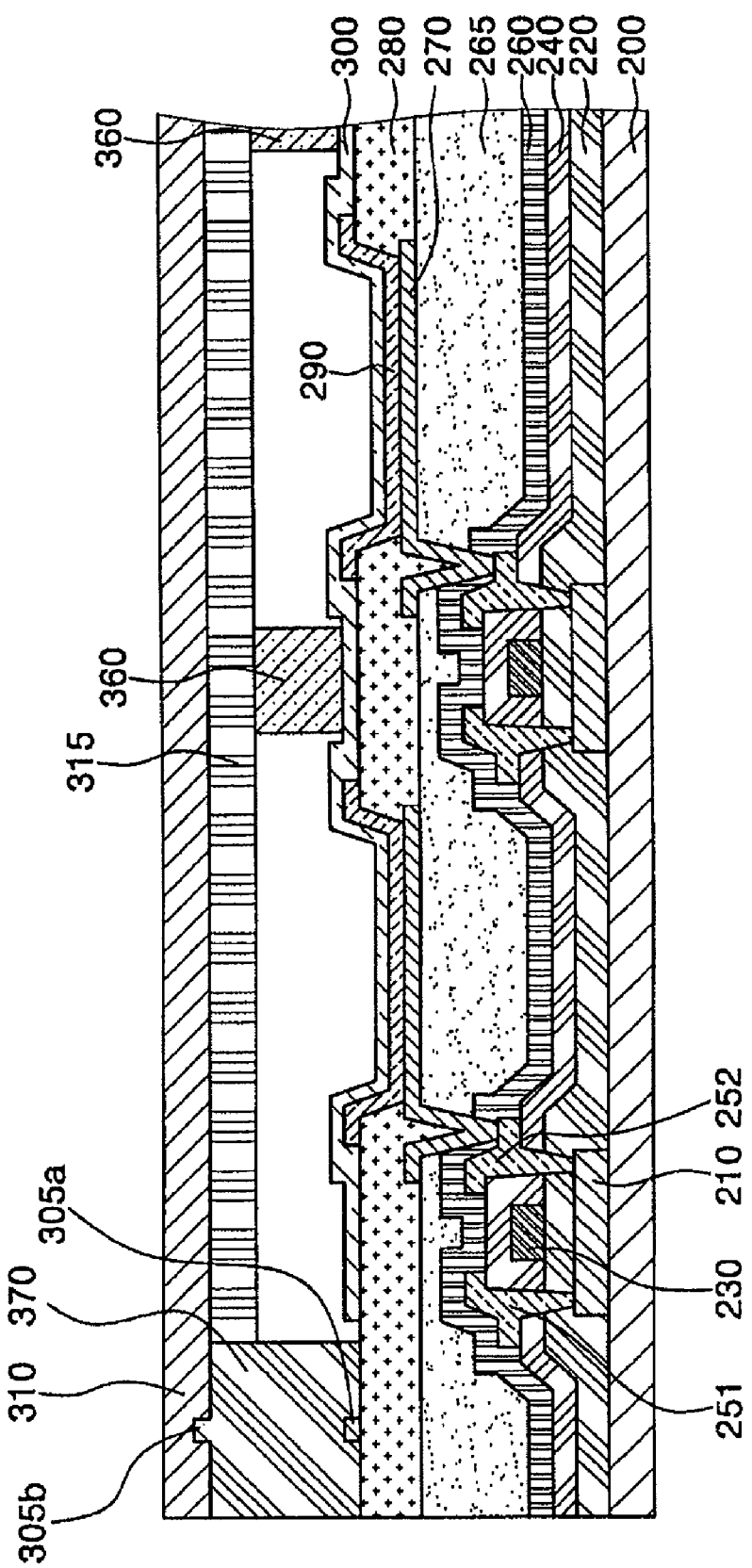

Referring to FIG. 6, an alignment key 305b is formed in an encapsulation region of the encapsulation substrate 310 where an encapsulant will be formed later or a scribe region. The alignment key 305b may be etched in a groove shape. Thus, the alignment key 305b may correspond to an alignment key 305a, which is subsequently formed on the substrate 200, and facilitate the alignment of the encapsulation substrate 310 with the substrate 200.

Subsequently, the encapsulant or seal is formed on the encapsulation substrate 310, and the encapsulation substrate 310 is aligned and encapsulated with the substrate 200 using the alignment keys 305a and 305b. In this case, the spacer 360 is in contact with at least one of regions between the unit pixels and supports the encapsulation substrate 310 against external shock. In this process, the OLED according to the exemplary embodiment of the present invention is completed.

As described above, the spacer 360 is formed on the moisture absorbent layer 315 using an LITI process so that the moisture absorbent layer 315 can be prevented from being damaged by strip and develop solutions. Also, the spacer 360 is positioned between the substrate 200 and the encapsulation substrate 310, thus preventing the damage of the OLED due to external shock.

According to embodiments of the present invention as described above, a spacer is formed on an encapsulation substrate or a moisture absorbent layer using an LITI process. As a result, a spacer forming process can be simplified, the damage of the moisture absorbent layer can be reduced, and the damage of an OLED due to external shock can be prevented.

Although various embodiments of the present invention has been described, it will be understood by those skilled in the art that a variety of modifications and variations may be made to the present invention without departing from the spirit or scope of the present invention defined in the appended claims, and their equivalents.

What is claimed is:

1. An organic light emitting display device (OLED) comprising:
   a base substrate;
   an array of a plurality of organic light emitting pixels formed on the base substrate;
   an encapsulation substrate opposing the base substrate, wherein the array is interposed between the base substrate and the encapsulation substrate;
   a moisture absorbent layer formed on the encapsulation substrate and comprising a surface facing the array; and
   a spacer disposed between the moisture absorbent layer and the array, wherein the spacer contacts a selected portion but not all of the surface of the moisture absorbent layer;
   wherein the OLED further comprises a seal interposed between and interconnecting the base substrate and the encapsulation substrate, wherein the seal comprises a projection on a surface thereof facing the encapsulation substrate, and wherein the encapsulation substrate comprises a groove formed on a surface facing the base substrate and receiving the projection of the seal.

2. The OLED according to claim 1, further comprising a thin film transistor (TFT) which comprises a semiconductor layer, a gate electrode, and source and drain electrodes.

3. The OLED according to claim 1, further comprising an alignment key disposed on the encapsulation substrate.

4. The OLED according to claim 1, wherein the spacer is formed of an organic material.

5. The OLED according to claim 1, wherein the spacer is formed of an inorganic material.

6. The OLED according to claim 1, wherein the spacer contacts a non-emissive surface of the array.

7. The OLED according to claim 6, wherein the non-emissive surface is interposed between immediately neighboring emissive surfaces of the array.

8. The OLED according to claim 7, wherein the spacer contacts the surface of the moisture absorbent layer at a location that is on an imaginary line perpendicular to the surface of the moisture absorbent layer and passing a point on the non-emissive surface.

9. A method of fabricating the OLED of claim 1, the method comprising:
   providing the base substrate and the array of a plurality of organic light emitting pixels formed on the base substrate, wherein the array comprises a plurality of emissive surfaces and a plurality of non-emissive surfaces, wherein one of the non-emissive surfaces interposed between two neighboring emissive surfaces;
   providing the encapsulation substrate with a moisture absorbent layer and a spacer, wherein the moisture absorbent layer is formed on the encapsulation substrate, and wherein a spacer is formed on the moisture absorbent layer; and
   arranging and interconnecting the encapsulation substrate and the base substrate such that the spacer contacts the moisture absorbent layer and is interposed between the array and the moisture absorbent layer.

10. The method according to claim 9, further comprising forming a TFT on the base substrate, the TFT comprising a semiconductor layer, a gate electrode, and source and drain electrodes.

11. The method according to claim 9, wherein the encapsulation substrate comprises an alignment key.

12. The method according to claim 9, wherein the spacer is formed on the moisture absorbent layer by using a laser induced thermal imaging (LITI) process.

13. The method according to claim 9, wherein the LITI process comprises:
   providing a donor substrate comprising a base layer, a light-to-heat conversion (LHC) layer and a transfer layer formed of a spacer, wherein the a light-to-heat conversion (LHC) layer is interposed between the base layer and the transfer layer;
   bonding the donor substrate to the moisture absorbent layer formed on the encapsulation substrate; and irradiating laser beams on a selective region of the donor substrate so as to transfer a portion of the transfer layer and form the spacer.

14. The method according to claim 9, wherein the spacer forming material layer comprises an organic material.

15. The method according to claim 9, wherein the spacer forming material layer comprises an inorganic material.

16. The method according to claim 9, wherein the spacer contacts a non-emissive surface of the array.

17. An organic light emitting display device comprising:
a first substrate;
a second substrate opposing the first substrate;
an array of organic light emitting pixels interposed between the first and second substrates;
a desiccant layer formed on the second substrate; and
a spacer interposed between the array and the desiccant layer, wherein the spacer contacts both the array and the desiccant layer,
wherein the array comprises a plurality of emissive surfaces and a plurality of non-emissive surfaces, and wherein one of the non-emissive surfaces interposed between two neighboring emissive surfaces, wherein the spacer contacts one of the plurality of non-emissive surfaces of the array.

18. A method of making the organic light emitting device of claim 17, which comprises:
providing the first substrate and the array formed on the first substrate;
providing the second substrate, a desiccant layer and a spacer, wherein the desiccant layer is formed on the second substrate, wherein the spacer is formed on a portion of the desiccant layer such that the portion of the desiccant layer is interposed between the second substrate and the spacer; and
arranging the first substrate and the second substrate such that the spacer contacts the array.

19. The method of claim 18, wherein the spacer is formed on the desiccant layer by using a LITI process.

* * * * *

UNITED STATES PATENT AND TRADEMARK OFFICE
CERTIFICATE OF CORRECTION

PATENT NO. : 7,893,614 B2  Page 1 of 1
APPLICATION NO. : 11/876681
DATED : February 22, 2011
INVENTOR(S) : Tae-Wook Kang It is certified that error appears in the above-identified patent and that said Letters Patent is hereby corrected as shown below:

In Column 2, Line 33, change "the a" to --a--.

In Column 8, Line 58, change "claim 9," to --claim 12,--.

In Column 8, Line 63, change "the a" to --a--.

Signed and Sealed this
Twenty-second Day of November, 2011

David J. Kappos
*Director of the United States Patent and Trademark Office*